INVENTORS
ANDREW E. BRENNEMANN
DONALD P. SERAPHIM
SABIH TANSAL

BY S. P. Tedesco
ATTORNEY

United States Patent Office 3,386,163

Patented June 4, 1968

3,386,163

METHOD FOR FABRICATING INSULATED-GATE FIELD EFFECT TRANSISTOR

Andrew E. Brennemann, Chappaqua, Donald P. Seraphim, Bedford Hills, and Sabih Tansal, Jackson Heights, N.Y., assignors to International Business Machines Corporation, New York, N.Y., a corporation of New York Filed Aug. 26, 1964, Ser. No. 392,144
20 Claims. (Cl. 29—571)

The invention relates to improved methods for fabricating insulated-gate field effect transistor devices having tailored operating characteristics.

At the present time, the electronics industry is directing much effort toward the development of techniques for batch-fabricating large numbers of solid-state circuit elements of microminiature dimensions along with functional interconnections onto a single substrate. By this development, industry hopes to overcome certain problems resulting from the increased complexity of present-day electronic systems and, also, the objectionable high cost of fabricating the same. The objective of such development is to reduce the size, weight, and unit cost of the solid-state circuit elements and, also, to improve reliability and power utilization from the system viewpoint.

The scientific literature is replete with descriptions of new solid-state circuit elements suitable for batch-fabrication techniques. For example, one such circuit element is the insulated-gate field effect transistor. Basically, a field effect transistor comprises a metallic gate electrode spaced from the surface of a high resistivity semiconductor material of first conductivity type by a thin layer of dielectric material; in addition, source and drain electrodes are defined by spaced surface portions of opposite conductivity type. Electrical fields generated by gate electrode bias control the carrier density along the surface, or conduction, channel of the semiconductor material and, therefore, conduction between source and drain electrodes. The field effect transistor, being a voltage control device, is more nearly the equivalent of a vacuum tube triode than of a current control conventional transistor device.

These batch fabrication efforts, based somewhat on known silicon junction technology, intend that large numbers of field effect transistors, either NPN or PNP, will be concurrently formed onto a semiconductor wafer (e.g., silicon). In such arrangements, the semiconductor wafer forms an essential constituent part of each field effect transistor and, also, provides appropriate support therefor. Certain limitations, however, are inherent in known methods of batch-fabricating field effect transistors. In part, the respective threshold voltages and transconductances $g_m$ of a number of batch-fabricated field effect transistors can very appreciably from the designed norm. The ability to tailor the characteristics of the field effect transistors on an individual basis would simplify the layout and, also, design of functional interconnections in an operative circuit arrangement. Further, a same operational mode is exhibited by the batch-fabricated field effect transistors. For example, NPN field effect transistors fabricated by present day techniques onto a same semiconductor wafer generally exhibit depletion mode operation, i.e., substantial source-drain current $I_{SD}$ flows at zero-gate bias; also, PNP field effect transistors generally exhibit enhancement mode operation, i.e., negative-gate bias is necessary to draw substantial source-drain current $I_{SD}$. Accordingly, NPN field effect transistors are normally "ON" devices and PNP field effect transistors are normally "OFF" devices. Biasing techniques to obtain both "ON" and "OFF" field effect transistors on the same semiconductor wafer complicate the integration of such transistors to form an operative arrangement and, in fact, require additional power supplies.

The characteristic operational modes exhibited by field effect transistors are due to an excess of donor states along the conduction channel. Such condition results from a positive voltage which appears to build-up in the dielectric, or insulating, layer and creates an electronic space charge, i.e., excess donor states, in the narrow surface portion of the semiconductor material. In the NPN-type structures, these space charge effects can define an ohmic conduction path (inversion layer) between the source and drain electrodes. Similarly, in the PNP-type structure, these space charge effects define a higher resistivity conduction path (accumulation layer) between the source and drain electrodes; albeit a PNP-type structure is a normally "OFF" device, increased negative-gate bias is required to induce useful source-drain current $I_{SD}$. The metallurgical problem of forming a plurality of field effect transistors into operative arrangement would be greatly simplified if not only the operational modes but, also, the operating characteristics of such devices could be tailored in accordance with circuit requirements.

Accordingly, an object of this invention is to provide a novel method for fabricating a plurality of field effect transistors, either NPN or PNP, onto a semiconductor wafer so as to exhibit predetermined operational modes.

Another object of this invention is to provide a novel method for individually tailoring the operating characteristics of a plurality of field effect transistors, either NPN or PNP, formed on a semiconductor wafer.

Another object of this invention is to provide a novel method for determining, on an individual basis, the operational modes of a plurality of field effect transistors of same type formed on a semiconductor wafer.

Another object of this invention is to provide a novel method for forming integrated circuit arrangements comprising field effect transistors.

Another object of this invention is to provide a novel method for controlling the surface states at a semiconductor-insulator interface.

The operating characteristics exhibited by field effect transistors of particular type is dependent upon space charge effects along the conduction channel adjacent the semiconductor-insulator interface. Generally, the transition from the ordered crystal lattice of the semiconductor material to the amorphous structure of the insulating layer at the semiconductor-insulator interface represents a major structural discontinuity along which anion vacancies are distributed. When the insulating layer is formed of silicon dioxide ($SiO_2$), such anion vacancies are oxide-ion vacancies $[O]^{++}$ which arise due to defect structures resulting from the nature of the structural discontinuity and the chemical reaction of the insulator and semiconductor materials at the semiconductor-insulator interface. The presence of oxide-ion vacancies $[O]^{++}$ induces a net positive voltage in the insulating layer and increases the density of donor states at the surface of the semiconductor material. The ability to control space charge effects in batch-fabricated field effect transistors on an individual basis would allow tailoring of the respective operating characteristics in accordance with circuit requirements.

Numerous attempts are evidenced in the prior art to minimize space charge effects in field effect transistors. For example, such attempts have included thermal treatments between 100° C. and 150° C. which have only mitigated but have not eliminated space charge effects. Such prior art treatments, while effective to vary slightly the operating characteristics, have been totally ineffective to irreversibly convert the operational modes of field effect transistors between enhancement mode and depletion mode so as to obtain a full and complete measure of device control.

In accordance with this invention, a full measure of device control is achieved by the neutralization, or compensation, of oxide-ion vacancies $[O]^{++}$ in the insulating layer to control residual carrier density along the conduction channel in a field effect transistor. Further, when the oxide-ion vacancies $[O]^{++}$ are overcompensated, an opposite charge (negative) is induced in the insulating layer whereby the operational mode of the field effect transistor is irreversibly altered. In accordance with one aspect of this invention, therefore, the characteristics of field effect transistors, both NPN and PNP, are continuously tailored between deep enhancement and deep depletion mode operations by introducing negatively-charged impurities into the insulating layer and subjecting the insulating layer to electrical fields while maintained at an elevated ambient temperature. A model is described wherein the insulating material is silicon dioxide ($SiO_2$) and the negatively-charged impurity is a trivalent oxide which can exist in a glassy form and which is diffused into the insulating layer. At elevated temperatures, the mobility $\mu_v$ of the oxide-ion vacancy $[O]^{++}$ is greater than the mobility $\mu_i$ of the negatively-charged impurities. Under the influence of the applied electrical fields, the oxide-ion vacancies $[O]^{++}$ migrate away from the semiconductor-insulator interface and are caused to concentrate at the metal (gate electrode)-interface. Accordingly, the negatively-charged impurities and oxide-ion vacancies $[O]^{++}$ are redistributed within the insulating layer by the novel method of the invention. By proper control of the parameters of the thermal-biasing treatment and, also, the number of negatively-charged impurities introduced into the insulating layer, the potential gradient in the insulating layer is determined. Accordingly, space charge effects, i.e., oxide-ion vacancies $[O]^{++}$ at the semiconductor-insulator interface, can be partially neutralized, fully neutralized, or overneutralized so as to control residual carrier density along the conduction channel in a field effect transistor. When space charge effects are overneutralized (overcompensated), a net negative voltage is induced in the insulating layer which is reflected as an equal and opposite space charge, i.e., excess acceptor states, along the conduction channel. Therefore, since continuous control of space charge effects is available, not only the "turn-on" voltage, but, also, the operational mode of a field effect transistor, either NPN or PNP, can be selectively and irreversibly determined. Also, field effect transistors formed on a semiconductor wafer can be tailored on an individual basis by selective control of the electrical fields applied to each in accordance with the particular circuit requirements.

The foregoing and other objects, features, and advantages of the invention will be apparent from the following more particular description of preferred embodiments of the invention, as illustrated in the accompanying drawings.

Figure 1A:
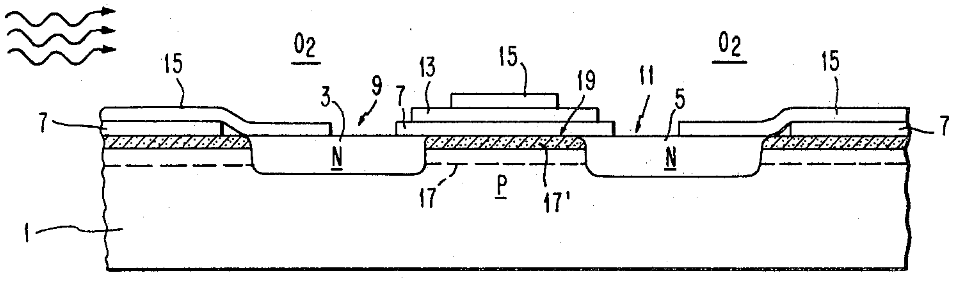
FIG. 1A shows a cross-sectional view of an NPN insulated-gate field effect transistor.

Referring to FIG. 1A, an NPN insulated-gate field effect transistor comprises a planar wafer 1 of relatively high resistance, p-type semiconductor material, e.g., silicon (Si), having diffused spaced portions 3 and 5 of n-type material defining source and drain electrodes, respectively. Source and drain electrodes 3 and 5 normally define rectifying junctions with silicon wafer 1. An insulating layer 7 is formed over the entire surface of wafer 1, and can be used during the diffusion process for masking purposes. For example, layer 7 can be thermally grown silica ($SiO_2$) prepared by exposing silicon wafer 1 at temperatures between 950° C. and 1125° C. to an atmosphere of either oxygen ($O_2$), oxygen and water vapor ($O_2+H_2O$), water vapor ($H_2O$), or carbon dioxide ($CO_2$). When insulating layer 7 has been formed, appropriate openings 9 and 11 are cut by suitable photolithographic or photoresist processes to provide "windows" for the diffusion of source and drain electrodes 3 and 5, respectively. For example, with insulating layer 7 acting as a chemical mask, wafer 1 can be heat-treated at temperatures ranging between 1100° C. and 1200° C. in a reactive atmosphere of phosphorous pentoxide ($P_2O_5$) to form source and drain electrodes 3 and 5. Also, in the showing of FIG. 1, insulating layer 7 electrically insulates wafer 1 and various metallic connecting lines 15, and, also, gate electrode 13 formed by suitable vapor deposition processes well known in the art. Gate electrode 13 is registered in electrical field-applying relationship with that portion of wafer 1 defined between the spaced source and drain electrodes 3 and 5. Functional connections, e.g., to operating voltage sources, not shown, are made to source and drain electrodes 3 and 5, and, also, gate electrode 13 along connecting line 15, respectively.

Conduction between source and drain electrodes 3 and 5 is primarily determined by the carrier density along a narrow surface, or conduction, channel 17 of wafer 1. More precisely, conduction between source and drain electrodes 3 and 5 is a two-fold mechanism. For example, when source and drain electrodes 3 and 5 are appropriately biased, source-drain current $I_{SD}$ comprises a diffusion current which is space charge limited due to source-drain biasing and, also, a drift current resulting from changes in carrier density along conduction channel 17 due to the electrical fields generated by gate electrode 13. Generally, the diffusion component of current is minimal and, for the most part, source-drain current $I_{SD}$ is primarily due to the action of electrical fields generated by gate electrode 13 in modulating carrier density along conduction channel 17. In the ideal NPN-type field effect transistor, carriers are repelled from the conduction channel 17 when gate electrode 13 is biased positively; if positive-gate bias is excessive, the excess donor states can actually convert the narrow surface portion p-type wafer 1 adjacent semiconductor-insulator interface 19 to n-type and form an ohmic connection (inversion layer) between source and drain electrodes 3 and 5.

The presence of excess donor states at the surface of wafer 1, as indicated by speckled hatching, due to the above-described space charge effects resulting from oxide-ion vacancies in insulating layer 7 is similar, in effect, to excessive positive-gate bias. In the NPN field effect transistor of FIG. 1A, the excess donor states at the surface of wafer 1 define an inversion layer 17' which has the effect of reducing the work function at junctions defined between source and drain electrodes 3 and 5 and wafer 1, respectively; depletion mode operation results and negative-gate bias is necessary to "turn-off" such transistors, i.e., reduce source-drain current $I_{SD}$ to substantially zero. Conversely, excess donor states in a PNP field effect transistor would define an accumulation layer which has the effect of increasing the work function at the defined junctions; an increased enhancement mode operation results whereby a larger negative-gate bias is required to "turn-on" such transistor.

Figure 1B:
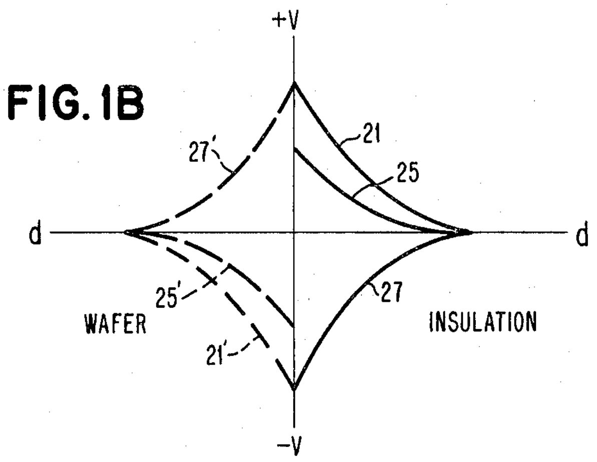
FIG. 1B is a diagram illustrating voltages induced in the insulating layer and reflected in the bulk semiconductor material of the field effect transistor of FIG. 1A.

The presence of inversion layers at all semiconductor-oxide interfaces as illustrated in FIG. 1A is due to the particular mechanism of the oxidation process and can be understood by reference to FIG. 1B. During the thermal oxidation processes, either "wet" or "dry," to form insulating layer 7, the resulting oxides of silicon may comprise either silicon monoxide (SiO), silicon dioxide ($SiO_2$), or an indeterminant form ($SiO_x$), the ratio being dependent upon system parameters. The oxidation process occurs at the surface boundary between wafer 1 and insulating layer 7 due to diffusion of oxidizing atmosphere through the insulating layer; it does not appear that the crystalline silicon material of wafer 1 diffuses outwardly toward the top surface of insulating layer 7. As oxides of silicon are amorphous, defect structures result at interface 19 which move as a front into the body of wafer 1 to a depth dependent on the extent and, also, the duration of the oxidation process. This structural fault front is formed primarily of silicon oxide ($SiO_x$) and can be represented as a strata of oxide-ion vacanices $[O]^{++}$. These oxide-ion vacancies $[O]^{++}$ are distributed substantially uniformly along interface 19 and in the insulating layer 7 appear as an induced positive voltage. For example, referring to FIG. 1B, curve 21 represents the distribution of oxide-ion vacancies $[O]^{++}$ within insulating layer 7, the magnitude of net positive charge being represented by the area under the curve. Since insulating layer 7 is amorphous, the oxide-ion vacancies $[O]^{++}$ are most concentrated near interface 19 and lessen as distance $d$ therefrom is increased. Due to the induced positive voltage in insulating layer 7, an equal and opposite electrostatic space charge is built-up in the opposing surface of wafer 1 as indicated by curve 21′ whereby the density of donor states is increased and resistivity along the top surface portion of p-type wafer 1 is reduced. It should be understood, however, that the presence of excess donor states along conduction channel 17 which define inversion layer 17′ can also result from positively-charged impurities in insulating layer 7. The presence of inversion layer 17′ determines the inherent depletion mode operation of the NPN field effect transistor of FIG. 1A; conversely, the presence of an "accumulation layer" increases the enhancement mode operation of PNP field effect transistors.

In accordance with the particular aspects of this invention, the induced positive charge in insulating layer 7 is neutralized, or compensated, by the introduction of negatively-charged impurities. The effects of neutralizing the oxide-ion vacancies $[O]^{++}$ in insulating layer 7 are illustrated in FIG. 1B. As hereinabove indicated, the area of each curve of FIG. 1B represents total charge and is dependent upon the concentration of un-neutralized oxide-ion vacancies $[O]^{++}$ in insulating layer 7. As oxide-ion vacancies $[O]^{++}$ in insulating layer 7 are neutralized, the net positive charge in insulating layer 7 is correspondingly reduced as indicated by curve 25; space charge effects in wafer 1 are correspondingly reduced as indicated by dashed curve 25′ having an area equal to that under curve 25. Accordingly, resistivity along the narrow surface portion of wafer 1, i.e., conduction channel 17, is increased along with the work functions defined therebetween and source and drain electrodes 3 and 5. The effect is to reduce the magnitude of source-drain current $I_{SD}$ at zero-gate bias whereby the operation of the NPN field effect transistor is less depleted. When the negatively-charged impurities just neutralize the oxide-ion vacancies $[O]^{++}$, insulating layer 7 is uncharged and the density of carrier states along conduction channel 17 is solely determined by the resistivity of the bulk semiconductor material forming wafer 1. However, when the negatively-charged impurities overneutralize the oxide-ion vacancies $[O]^{++}$, a net negative charge is induced in insulating layer 7, as indicated by curve 27, which is reflected at the narrow surface portion of the wafer 1 as a positive electrostatic space charge as indicated by dashed curve 27′. Accordingly, acceptor states are attracted to interface 19 and along conduction channel 17 which, it is evident, alter the operational mode of the particular transistor device. For example, in an NPN field effect transistor, excess acceptor states, i.e., holes, along conduction channel 17 increase material resistivity and, also, the work function at junctions defined therebetween and source and drain electrodes 3 and 5, respectively, whereby positive gate bias is required to draw minimal source-drain current $I_{SD}$ (enhancement mode operation). Conversely, an increased density of acceptor states along the conduction channel in a PNP field effect transistor would define an inversion layer and depletion mode operation would result. As the neutralization of oxide-ion vacancies $[O]^{++}$ in insulating layer 7 can be controlled, the "turn-on" voltage of a field effect transistor, either NPN or PNP, can be continuously tailored and the operational mode determined between deep enhancement and deep depletion.

In accordance with the particular aspects of this invention, oxide-ion vacancies $[O]^{++}$, which are doubly-charged positive, are effectively balanced in charge by an impurity material introduced in the matrix of insulating layer 7. The particular impurity material is selected as one capable of existing in the glassy form and forming a compound possessing a negative charge; moreover, the impurity material may exhibit a mobility $\mu_i$ which is less than the mobility $\mu_v$ of the oxide-ion vacancies $[O]^{++}$ in the lattice of insulating layer 7. The impurity material is selected to form a trivalent oxide and, for example, can be selected from the group III–A of the Periodic Table as exemplified by boron (B) and aluminum (Al). The impurity material is thermally diffused into the silicon dixode lattice either prior to or after the diffusion of the source and drain electrodes 3 and 5, depending on whether the diffusivity is less or greater than that for the impurity diffused for source and drain.

For example, during the above-described fabrication of the field effect transistor, insulating layer 7 is preferably formed by thermal treatment of wafer 1 is an oxygen atmosphere at a temperature between 950° C. and 1125° C. (see FIG. 1). In the preferred practice of this invention, impurity material in gaseous form is introduced, as indicated by the arrows, into the oxygen atmosphere and reacts to form an oxide layer over the surface of insulating layer 1. The oxidation process proceeds rapidly at such elevated temperatures. For example, in addition to elemental boron (B), the following are exemplary of boron compounds which react with oxygen to give as a product boron oxide ($B_2O_3$).

| | |
|---|---|
| Diborane | $B_2H_6$ |
| Tetraboran | $B_4H_{10}$ |
| Pentaborane (11) | $B_5H_{11}$ |
| Boron tribromide | $BBr_3$ |
| Boric acid | $H_3BO_3$ |
| Boron trichloride | $BCl_3$ |

Also, in addition to elemental aluminum, the following are exemplary of aluminum compounds which react with oxygen to give as a product aluminum oxide ($Al_2O_3$):

| | |
|---|---|
| Aluminum trichloride | $AlCl_3$ |
| Aluminum hydride | $AlH_3$ |
| Aluminum tribromide | $AlBr_3$ |
| Aluminum ethoxide | $Al(OC_2H_5)_3$ |

Various other Group III–A elements which can be employed in similar fashion will be evident to those skilled in the art.

During the oxidation process, an oxide of the selected Group III–A element initially forms over the surface of insulating layer 7. By subjecting the structure to thermal treatment in the range between 950° C. and 1125° C., the oxidation product is diffused into the matrix of insulating layer 7. This diffusion process is continued so as to distribute the impurity material substantially uniformly within oxide layer 7 but not long enough so as to cause diffusion therethrough and into the body of wafer 1. The oxidation product, i.e., boron oxide ($B_2O_3$), aluminum oxide ($Al_2O_3$), etc., when formed on the surface of insulating layer 7 are uncharged. The results achieved by the present invention appear to indicate that the oxidation product undergoes a structural change when diffused into the lattice of insulating layer 7. For example, a portion of the triangularly coordinated Group III–A-oxides appear to undergo a crystallographic change to tetrahedral in accordance with the following reactions:

$$B_2O_3 \rightarrow 2BO_2^- + [O]^{++}$$
$$Al_2O_3 \rightarrow 2AlO_2^- + [O]^{++}$$

the $[O]^{++}$ indicating that an oxide ion is removed from some part of the silicon dioxide lattice thereby generating an additional oxide-ion vacancy $[O]^{++}$. The reaction is balanced in that the negatively-charged impurities and the oxide-ion vacancies $[O]^{++}$ resulting from the diffusion process are substantially uniformly distributed throughout the silicon dioxide lattice and do not alter the net positive charge in the insulating layer 7 due to defect structures created during the oxidation process. However, and as hereinafter described, the mobility $\mu_i$ of the negatively-charged impurities, i.e., the trivalent oxide impurity, is less than the mobility $\mu_v$ of the oxide-ion vacancies $[O]^{++}$ in the normal silica structure. Accordingly, by subjecting the field effect transistor device to elevated temperatures which it can safely withstand to increase the mobility $\mu_v$ of oxide-ion vacancies $[O]^{++}$ and concurrently applying an electrical field of proper polarity across insulating layer 7, the oxide-ion vacancies $[O]^{++}$ migrate away from the semiconductor-insulator interface 19 and toward the metal (gate electrode)-insulator interface; any slight movement of the negatively charged impurities is toward the semiconductor-insulator interface 19. A redistribution of the negatively-charged impurities, e.g., $BO_2^-$, $AlO_2^-$, etc., and the oxide-ion vacancies $[O]^{++}$, both inherent and introduced, in the insulating layer 7 is obtained. Accordingly, migration of oxide-ion vacancies $[O]^{++}$ away from the semiconductor-insulator interface 19 is effective to reduce space charge effects at the surface of wafer 1. Due to the relatively low mobility $\mu_i$ of the negatively-charged impurities, the ratio of negatively-charged impurities to oxide-ion vacancies $[O]^{++}$ at the semiconductor-insulator interface 19 is increased. As migration of oxide-ion vacancies $[O]^{++}$ to the metal (gate electrode)-interface is space charge limited, a finite number of such vacancies remain in the vicinity of the semiconductor-insulator interface 19 which are neutralized by the negatively-charged impurities. Accordingly, space charge effects along the narrow surface portion of wafer 1 are reduced. By controlling the quantity of negatively-charged impurities diffused into insulating layer 7, the depth of diffusion, and, also, the duration and extent of the treatment hereinabove described, space charge effects in wafer 1 can be controlled; the ratio of the negatively-charged impurities to oxide-ion vacancies $[O]^{++}$ at semiconductor interface 19 can be determined such that a negative voltage is induced in insulating layer 7 whereby space charge effects in wafer 1 are positive (reverse operational mode).

Figure 2:
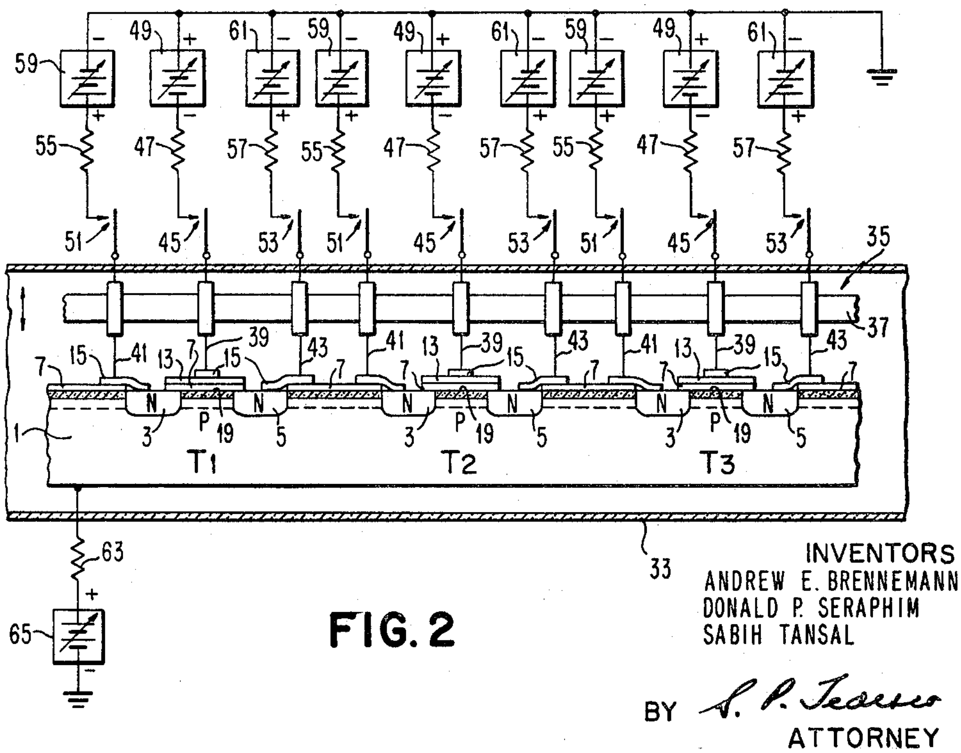
FIG. 2 shows a cross-sectional view of a p-type silicon wafer having formed thereon a plurality of NPN field effect transistors and, in addition, a preferred system for effecting the novel method of this invention.
Figure 3A:
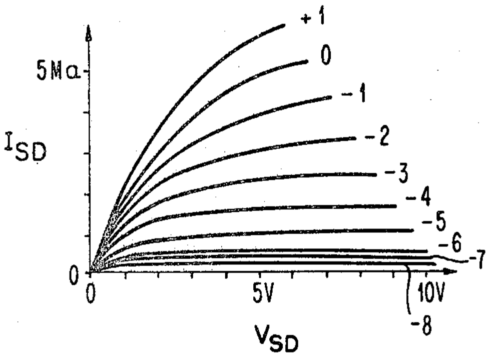
FIGS. 3A and 3B illustrate the source-drain current $I_{SD}$-source-drain voltage $V_{SD}$ characteristic curves for various values of gate voltage before and after, respectively, a thermal-biasing treatment in accordance with the method of this invention.

In accordance with the above-described mechanism, operational modes as well as "turn-on" voltages of field effect transistors formed as an array in a single wafer 1, as shown in FIG. 2, can be determined on an individual basis. The individual field effect transistors $T_1$, $T_2$, $T_3$, etc., of FIG. 2 are identical to that shown in FIG. 1A and similar characters have been employed to identify corresponding structures. In the description, reference will be made to FIGS. 3A and 3B which illustrate source-drain current $I_{SD}$ versus source-drain voltage $V_{SD}$ characteristics of NPN field effect transistors fabricated in accordance with prior art methods and by the method of this invention, respectively. As illustrated in FIG. 3A, appreciable source-drain current $I_{SD}$ normally flows along conduction channel 17 at zero-gate bias; accordingly, a bias voltage of approximately minus 8 volts is required either on gate electrode 13 or silicon wafer 1 to reduce source-drain current $I_{SD}$ to substantially zero.

In the practice of this invention, wafer 1 is positioned within an oven system 33 and the field effect transistor array is registered with a probing arrangement, generally indicated as 35. The negatively-charged impurities have been diffused into insulating layer 7. Probing arrangement 35 includes a movable structure 37 supporting a number of feeler contacts 39 each corresponding to a gate electrode 13; also, structure 37 carries a number of additional feeler contacts 41 and 43 each corresponding to source and drain electrodes 3 and 5, respectively. Each feeler contact 39 is connected to switch 45 disposed exteriorly to oven 33 and along limiting resistor 47 to a variable negative voltage source 49; also, feeler contacts 41 and 43 are connected to switches 51 and 53, respectively, and along limiting resistors 55 and 57, respectively, to variable positive voltage sources 59 and 61, respectively. Also, silicon wafer 1 is connected along a limiting resistor 63 to variable positive voltage source 65. Voltage sources 49, 59, and 61 and 65 are each reducible to zero volts. Accordingly, while wafer 1 is maintained at an elevated temperature in oven 33 (i.e., 290° C.–400° C. or higher), electrical fields of selected magnitude can be applied either transverse or longitudinal to insulator layer 7 of the individual field effect transistors.

Consider that the boron oxide ($B_2O_3$) has been diffused into insulating layer 7 and that source and drain electrodes 3 and 5 have been diffused and that gate electrode 13 and connections 15 have been formed. Structure 37 is then positioned such that feelers 39, 41, and 43 are electrically continuous along connections 15 with gate electrode 13, source electrode 3, and drain electrode 5, respectively. In accordance with one aspect, switches 45 only are closed whereby each insulating layer 7 in transistors $T_1$, $T_2$, $T_3$, etc. is subjected to orthogonal electrical fields generated between wafer 1 and the corresponding gate electrode 13 of a magnitude determined by the relative settings of the corresponding voltage source 49 and source 65. When oven 33 is elevated to a selected temperature, i.e., in the range of 290° C. and 400° C., the application of orthogonal electrical fields to insulator layer 7 causes the oxide-ion vacancies $[O]^{++}$ to migrate away from the interfaces 19 to reduce the induced positive charge in insulating layer 7 along with space charge effects in the adjacent surface of wafer 1. Concurrently, the negatively-charged impurities migrate to a lesser degree toward the semiconductor-insulator interface 19. The amount of compensation of the induced positive charge in insulating layer 7 is dependent upon (1) the number of impurities introduced with insulating layer 7, (2) the strength of the applied electrical fields, (3) the ambient temperature, and (4) the duration of the thermal bias treatment. For example, in an ambient of approximately 300° C., a negative voltage of from 20 volts to 60 volts applied to gate electrode 13 (relative to wafer 1) for a period of time varying from 15 minutes to 2 hours is effective to convert an NPN field transistor from depletion to enhancement mode operation; the process is reversible, the required time duration being significantly reduced.

Figure 3B:
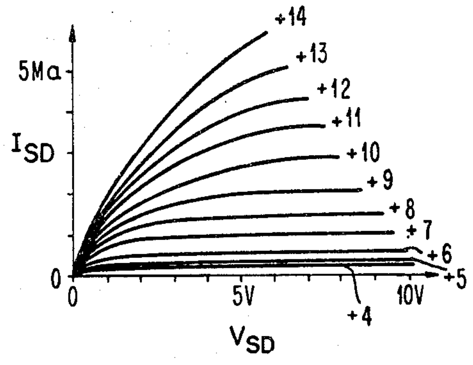
Figure 4A:
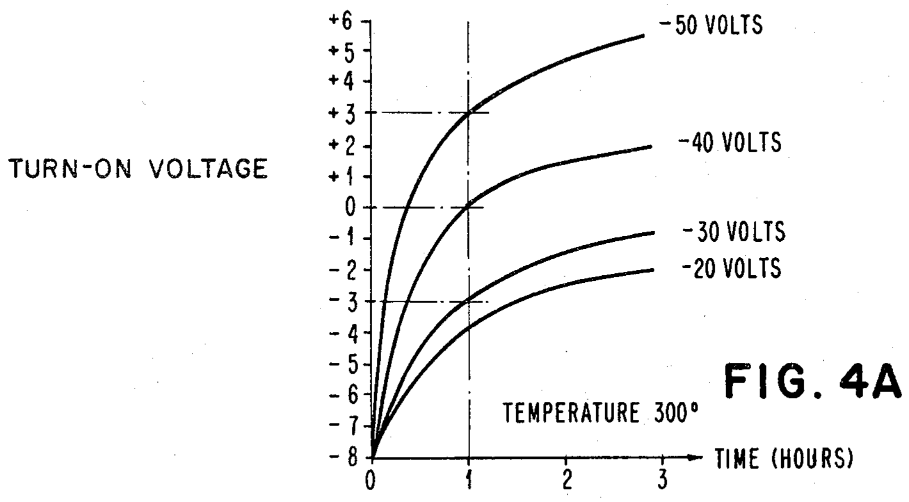
FIG. 4A is a time study of the thermal-biasing treatment in accordance with this invention.
Figure 4B:
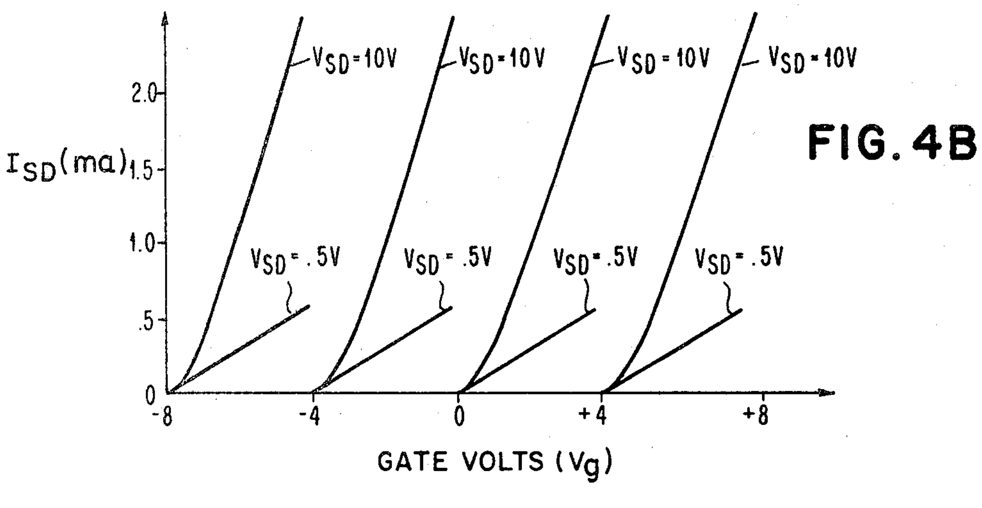
FIG. 4B shows the effects of such thermal-biasing treatment on the turn-on voltage of a field effect transistor.

The thermal biasing treatment of an NPN field effect transistor can be understood by reference to FIGS. 3A, 3B, 4A, and 4B. As shown in FIG. 3A, an NPN field effect transistor as shown in FIGS. 1A and 2 may exhibit a "turn-on" voltage of approximately minus 8 volts. In FIG. 4A, the tailored "turn-on" voltage of such transistor is plotted as a function of time $t$ at various biasing voltages applied to gate electrode 13 at a given ambient temperature. The curves of FIG. 4A, somewhat idealized, indicate that the tailoring effects achieved are dependent both upon the duration of treatment and, also, the magnitude of the biasing voltage (magnitude of electrical fields) applied between wafer 1 and gate electrode 13; it should be understood, however, that such effects are likewise dependent on ambient temperature. As illustrated in FIG. 4B, by controlling the thermal biasing treatment, the "turn-on" voltage and, also, the characteristics of the field effect transistor are displaced continuously whereby the "turn-on" voltage reduces from minus 8 volts (depletion mode) to zero volts which indicates no inversion layer along conduction channel 17, and then increases to plus 4 volts and beyond (enhancement mode) when excess acceptor states are present along the conduction channel 17. Accordingly, and as shown in FIG. 3B and, also, FIG. 4B, the NPN field effect transistor is permanently converted to enhancement mode operation having a positive "turn-on" voltage depicted as plus 4 volts, the conversion from depletion mode to enhancement mode being continuous and irreversible.

In accordance with the method of this invention, each of NPN field effect transistors formed on wafer 1 can be individually tailored in accordance with precise specifications of a circuit design. Assuming for purposes of description that field effect transistors $T_1$, $T_2$, and $T_3$ exhibit identical characteristics, e.g., a "turn-on" voltage of approximately minus 8 volts as illustrated in FIG. 3A, also, assume field effect transistor $T_1$ is to be tailored to exhibit a "turn-on" voltage of approximately plus 4 (enhancement mode); field effect transistor $T_2$ is to exhibit a "turn-on" voltage of approximately minus 4 volts (depletion mode); and transistor $T_3$ is to exhibit a "turn-on" voltage of zero volts. For example, while wafer 1 is maintained at a selected ambient temperature in oven 33, say 300° C., switches 45 are closed and sources 49 corresponding to transistors $T_1$, $T_2$, and $T_3$ and source 65 connected to wafer 1 are set in accordance with FIG. 4A. Since the duration of treatment is identical, the degree of tailoring of transistors $T_1$, $T_2$, and $T_3$ is singularly determined by the settings of corresponding sources 49, wafer 1 being maintained at a predetermined voltage source 65. Referring to FIG. 4A, for a thermal biasing treatment of one hour, the desired tailoring can be achieved by applying 50 volts, 30 volts, and 40 volts to gate electrodes 13 of transistors $T_1$, $T_2$, and $T_3$, respectively, when wafer 1 is maintained at zero volts. Subsequently, wafer 1 is allowed to cool with biasing voltages applied to the gate electrodes 13 of field effect transistors $T_1$, $T_2$, and $T_3$, respectively. The thermal biasing treatment, as described, does not substantially alter the shape of the operating characteristics of the individual field effect transistors; rather, such treatment only displaces them as illustrated in FIG. 4B to alter the "turn-on" voltage. When the "turn-on" voltage of a field effect transistor is not to be tailored, the corresponding switch 45 is unoperated whereby the transistor is subjected only to a thermal treatment. As hereinabove described, thermal treatment is ineffective to substantially alter the operating mode of a field effect transistor.

Desired tailoring of a field effect transistor can also be achieved by selectively applying particular combinations of voltages to wafer 1, source electrode 3, drain electrode 5, and gate electrode 13. For example considering FIG. 2, transistor $T_1$ can also be converted from depletion to enhancement operation by biasing gate electrode 13 negatively with respect to source and drain electrodes 3 and 5 and/or wafer 1, that is, switches 45, 51, and 53 are each closed. By such technique, electrical fields are applied to the junctions defined between source and drain electrodes 3 and 5 and wafer 1, respectively, as well as insulating layer 7. When switches are closed and a same magnitude of voltage is applied to wafer 1 and source and drain electrodes 3 and 5, an improvement of 20 percent in time and, also, a total shift of the operating characteristics of a same proportion are obtained at a given ambient temperature over the method hereinabove described. Also, conversion of an NPN field effect transistor to enhancement mode operation can also be obtained by applying tangential as well as longitudinal electrical fields to conduction channel 17. For example, while gate electrode 13 is biased negatively with respect to wafer 1, voltage sources 59 and 61 are set so as to bias drain electrode 5 positively with respect to source electrode 3. Since voltages applied across gate electrode 13 and source electrode 3 and, also, gate electrode 13 and drain electrode 5 are different, resultant electrical fields applied across conduction channel 17 are not uniform. The effect is to taper conductive channel 17 whereby the density of carrier states therealong is graded and an asymmetry is introduced into the characteristics of the field effect transistor.

While the tailoring of the operating characteristics of NPN field effect transistors has been hereinabove described, it should be evident that similar tailoring effects can be obtained with PNP field effect transistors. In such instances, a same polarity of voltages are applied to the wafer 1, source and drain electrodes 3 and 5 and, also, gate electrode 13. It is evident that PNP field effect transistors, normally exhibiting enhancement mode operation are characterized by a high density of donor states at interface 19. By applying electrical fields of a same polarity, therefore, the density of acceptor states along conduction channel 17 is increased so as to lower material resistivity in accordance with the above-described mechanism to a level whereat substantial source-current $I_{SD}$ flows at zero-gate bias (depletion mode).

While the invention has been particularly shown and described with reference to preferred embodiments thereof, it will be understood by those skilled in the art that various changes in form and details may be made therein without departing from the spirit and scope of the invention.

What is claimed is:

1. In a method for forming an insulated-gate field effect transistor which includes the steps of forming diffused spaced portions of one conductivity type in a semiconductor wafer of opposite conductivity type, said diffused spaced portions defining source and drain electrodes, respectively, forming an insulating layer at least over portions of said wafer intermediate said diffused spaced portions, the narrow surface portion of said wafer intermediate said diffused spaced portions defining a conduction channel therebetween, and forming a metallic gate electrode over said insulating layer so as to apply electrical fields to said conduction channel, the improvement comprising the steps of diffusing charged impurity material into at least a portion of said insulating layer, the presence of said charged impurity material in said insulating layer affecting space charge effects along said conduction channel whereby residual carrier density along said conduction channel is controlled, subjecting said insulating layer to electrical fields, and maintaining said transistor at a temperature of at least 290° C. while said electrical fields are applied to control space charge effects along said conduction channel due to the presence of said charged impurity material in said insulating layer.

2. A method of controlling residual carrier density along the narrow surface portion of a semiconductor body at a semiconductor body-insulating layer interface, said residual carrier density along said surface portion being determined, in part, by space charge effects due to anion vacancies in said insulating layer, said method comprising the steps of diffusing charged impurities into said insulating layer, said charged impurities being of such nature as to exhibit a mobility less than the mobility of the anion vacancies in the lattice of said insulating layer, maintaining said insulating layer at an elevated temperature to increase the mobility of said anion vacancies in the lattice of said insulating layer, and subjecting said insulating layer while at such elevated temperature to electrical fields of predetermined magnitude and duration such as to cause migration of anion vacancies from said interface, said charged impurities being effective to neutralize at least a portion of said space charge effects due to anion vacancies remaining in the vicinity of said interface.

3. The method of claim 2 including the further step of so diffusing said impurity material that it is substantially uniformly distributed in said insulating layer.

4. The method of claim 2 including the further step of diffusing said impurity material into said insulating layer in sufficient amount so as to substantially fully neutralize said space charge effects when said insulating layer is subjected to said electrical fields.

5. The method of claim 2 including the further step of diffusing said impurity material into said insulating layer in sufficient amount to overneutralize said space charge effects when said insulating layer is subjected to said electrical fields.

6. The method of claim 2 wherein said semiconductor body is formed of silicon and said insulating layer is formed of an oxide of silicon, and said charged impurity is a trivalent oxide which can exist in a glassy state.

7. The method of claim 6 including the further step of maintaining said insulating layer at a temperature at least in excess of 290° C. while said electrical fields are applied.

8. The method of claim 6 wherein said charged impurity is an oxide of boron.

9. The method of claim 6 wherein said charged impurity is an oxide of aluminum.

10. The method of determining residual carrier density along the narrow surface portion of a semiconductor body at a semiconductor body-insulating layer interface, carrier density along said surface portion being determined, in part, by spaced charge effects due to the presence of an induced voltage in said insulating layer, said method comprising the steps of forming said insulating layer over said semiconductor body, and diffusing charged impurity material into at least a portion of said insulating layer, said charged impurity material diffused into said insulating layer being effective to neutralize at least a portion of said spaced charge effects to control residual carrier density along said surface portion.

11. The method of claim 10 wherein said insulating layer is formed genetically as an oxide layer over said semiconductor body and said space charged effects appear to arise from oxide-ion vacancies in the lattice structure thereof, said impurity material being negatively-charged, and including the further steps of maintaining the semiconductor body-insulating layer structure at an elevated temperature, and subjecting said insulating layer to electrical fields to control the distribution of said charged impurities and said oxide-ion vacancies in the lattice of said insulating layer whereby space charge effects along said surface portion are controlled.

12. The method of controlling carrier density along the narrow surface portion of a semiconductor body at a semiconductor body-insulating layer interface, said carrier density being determined, in part, by space charge effects due to oxide-ion vacancies in said oxide layer, said method including the steps of forming a layer of impurity material over the surface of said oxide layer, diffusing said impurity material into at least a portion of said insualting layer, said impurity material when diffused into said insulating layer being charged such as to compensate the charge of said vacancies, and subjecting said insulating layer to electrical fields while maintained at an elevated temperature so as to control the distribution of asid impurity material and said vacancies in the lattice of said insulating layer.

13. The method of claim 12 comprising the further step of forming said layer of impurity material by oxidation of an element from the group consisting of boron and aluminum, and so diffusing a portion of said layer of impurity material that it is substantially uniformly distributed within the lattice of said insulating layer.

14. The method of claim 12 comprising the further step of cooling the semiconductor body-insulating layer structure from said elevated temperature while said insulating layer is subjected to said electrical fields.

15. A method of forming a field effect transistor structure having tailored characteristics comprising the steps of forming source and drain electrodes electrically connected by a body of semiconductor material, a portion of said semiconductor body defining a conduction channel between said source and drain electrodes, depositing an insulating layer over at least that portion of said semiconductor body defining said conduction channel, carrier density along said conduction channel being determined, in part, by space charge effects due to defect structures in said insulating layer, forming a metallic gate electrode over said insulating layer for applying electrical fields to said conduction channel, said method being characterized in the steps of diffusing a charged impurity into at least a portion of said insulating layer prior to the formation of said gate electrode, the charge of said impurity being such as to neutralize space charge effects along said conduction channel, and establishing said structure at a predetermined temperature to control neutralization of said space charge effects.

16. The method of claim 15 including the further step of generating said electrical fields by applying a selected voltage potential between said gate electrode and said semiconductor body while said structure is maintained at said predetermined temperature.

17. The method of claim 16 including the further step of allowing said structure to cool upon said space charge effects having been controlled while said voltage potential is applied between said gate electrode and said semiconductor body.

18. The method of claim 16 including the further step of applying a selected voltage between said gate electrode and said source and drain electrodes.

19. The method of claim 18 including the further step of applying voltages of differing magnitudes between said source electrode and said gate electrode and also between said drain electrode and said gate electrode.

20. The method of claim 12 wherein the step of forming said layer of impurity material includes the steps of locating said body in an oxygen atmosphere, and introducing elemental material selected from the group consisting of aluminum and boron in gaseous form over said insulating layer in an ambient temperature in excess of 950° C. whereby said elemental material is oxidized to form said layer of impurity material.

References Cited

UNITED STATES PATENTS

| | | | |
|---|---|---|---|
| 2,750,541 | 6/1956 | Ohl | 317—235 |
| 2,787,564 | 4/1957 | Shockley | 148—1.5 |
| 2,981,646 | 4/1961 | Robinson | 148—1.5 |
| 3,040,218 | 6/1962 | Byczkowski | 317—234 |
| 3,056,888 | 10/1962 | Atalla. | |
| 3,177,100 | 4/1965 | Mayer | 148—175 |
| 3,183,128 | 5/1965 | Leistiko | 148—186 |
| 3,226,611 | 12/1965 | Haenichen | 317—234 |
| 3,226,614 | 12/1965 | Haenichen | 317—234 |
| 3,243,669 | 3/1966 | Sah | 317—234 |

WILLIAM I. BROOKS, *Primary Examiner.*